(12) United States Patent
Huang

(10) Patent No.: US 6,894,377 B2
(45) Date of Patent: May 17, 2005

(54) RECTIFICATION CHIP TERMINAL STRUCTURE

(76) Inventor: Wen-Huo Huang, 1F, No. 680, Fuchang St., Cyonglin Township, Hsinchu Hsien (TW)

( * ) Notice: Subject to any disclaimer, the term of this patent is extended or adjusted under 35 U.S.C. 154(b) by 17 days.

(21) Appl. No.: 10/600,529

(22) Filed: Jun. 23, 2003

(65) Prior Publication Data

US 2004/0256713 A1 Dec. 23, 2004

(51) Int. Cl.⁷ .............................................. H01L 23/06
(52) U.S. Cl. ...................... 257/684; 257/698
(58) Field of Search ................ 257/684, 706, 257/704, 678, 666, 689, 698

(56) References Cited

U.S. PATENT DOCUMENTS 5,005,069 A * 4/1991 Wasmer et al. ............. 257/687
6,060,776 A * 5/2000 Spitz et al. ................. 257/706
6,559,529 B2 * 5/2003 Torti et al. .................. 257/684

* cited by examiner

Primary Examiner—Howard Weiss
Assistant Examiner—(Vikki) Hoa B. Trinh
(74) Attorney, Agent, or Firm—Birch, Stewart, Kolasch & Birch, LLP

(57) ABSTRACT

This invention discloses a rectification chip terminal structure that mounts a rectification chip into a terminal by means of soldering and rubber injection, and inserts the chip into the pivotal hole on the printed wire board. Such terminal comprises a rib ring surrounding the terminal, a platform extended from the middle section of said terminal, a buffer groove formed between said platform and said rib ring, and a protruded ring extended from the periphery of said platform; when rubber is injected into the terminal, the rubber will go through the buffer groove and the protruded ring for the fixing action, and no air bubble will remain after the solidification of the rubber. It will increase the adhesive force between the rubber and the terminal, and also will increase the soldering area of the rectification chip, such that the space between the terminal and the rectification chip can be fully soldered to provide the best effect for a current flow with larger power.

7 Claims, 4 Drawing Sheets

US 6,894,377 B2

RECTIFICATION CHIP TERMINAL STRUCTURE

FIELD OF THE INVENTION

The present invention relates to a rectification chip terminal structure, more particularly to a rectification chip terminal structure giving the best effect for a very large power and complete rectification.

BACKGROUND OF THE INVENTION

A rectification terminal installed in an electric generator of automobiles can convert an alternate current into a direct current. The manufacturing process of such rectification terminal usually incorporates a chip (diode), and such diode generally comes with a solder preform on both corresponding sides of the rectification terminal; the foregoing terminal, solder preform, and chip are sent into a high-temperature furnace for heating to a temperature of 200–400° C. After the solder preform is heated, melted, and solidified, the chip can be soldered into the terminal. Finally, epoxy resin is used to seal around the periphery and package the terminal. However, such prior-art terminal has the following shortcomings:

(1) The adhesive side of the prior-art terminal is a plane, which gives a larger contact area with the solder preform. Therefore, after the prior-art terminal enters into a high-temperature furnace, the external edge of the solder preform is heated up first, and the speed of heating the internal and external edges is uneven, and thus causing the external edge of the solder preform to melt and solidify first, and embedding air between the solder preform and the terminal to form the so-called empty solder phenomenon. The rectification terminal is specially installed onto the electrode of an electric generator in a car, so that alternate current can be converted into direct current. If the soldering of the rectification terminal with the chip is incomplete and the contact area is small, then it will affect the flow of electric current, and cause abnormal operation as well as troubles to users.

(2) The inner bottom of the prior-art terminal is a plane; when the chip is soldered and glued on such plane, it may twist, deform, crack, or damage the chip easily due to the exertion of large forces on one side.

In addition, the U.S. Pat. No. 6,559,529 entitled "Press-fit diode for universal mounting" discloses a diode, comprising a housing, an electrode of die disposed in the housing, and a conductive tubular lead disposed on the electrode of die. The foregoing housing has a tubular conductive wall and a bottom surrounding one end of the tubular conductive wall. Each of the upper and lower peripheries of the tubular conductive wall has a guiding corner. Further, the foregoing electrode of die could be a diode or other device; one end of the foregoing conductive tubular lead is connected to the electrode of die; such lead passes through a C-shaped stress relief conductor; the volume of the housing can be filled up with an insulated compound such as rubber and the like. A layer of epoxy resin covers and seals the insulated compound, and then an insulated cap covers the epoxy resin layer. By means of the foregoing structure and design, the diode can be pressed into a hole on a bus.

However, the aforementioned design usually produces air bubbles when the epoxy resin layer is filled into the housing, and causes the epoxy resin layer and the insulated cap to deform and fall off, when the diode is pressed into the hole of the bus. As a result, the diode is stressed, which will seriously affect the current flow.

SUMMARY OF THE INVENTION

The primary objective of this invention is to solve the aforementioned problems and eliminate the drawbacks of cited prior art. The present invention is related to a terminal structure that can be applied to a very large electric power with a complete rectification, and effectively protects the rectification chip. When rubber is injected into the terminal, the rubber will go through the buffer groove and the protruded ring for the fixing action. After the rubber is melted and solidified, no air bubble will remain, and thus increasing the adhesion between the rubber and the terminal.

To accomplish the foregoing objective, the terminal structure of this invention comprises a rib ring surrounding the terminal, a platform extended from the middle section of said terminal, a buffer groove formed between said platform and said rib ring, and a protruded ring extended from the periphery of said platform, such that the soldering area of the rectification chip is increased by the platform without changing the structure and volume of the terminal, and thus forming a simple terminal structure for the rectification chip.

Another objective of this invention is to form two symmetric buffer grooves at the bottom of the terminal to provide an appropriate buffer deformation stress when rubber is injected into the rectification chip or pressed by external forces and form a plastic surface to accomplish the effect of preventing water vapor and air from entering.

A further objective of this invention is to increase the soldering area of the rectification chip when rubber is injected into the terminal, and allow a complete soldering between the terminal and the rectification chip to provide the best effect for a larger current flow.

BRIEF DESCRIPTION OF THE DRAWINGS

Other features and advantages of the present invention will become apparent in the following detailed description of the preferred embodiments with reference to the accompanying drawings, in which.

DETAILED DESCRIPTION OF THE PREFERRED EMBODIMENTS

Figure 1:
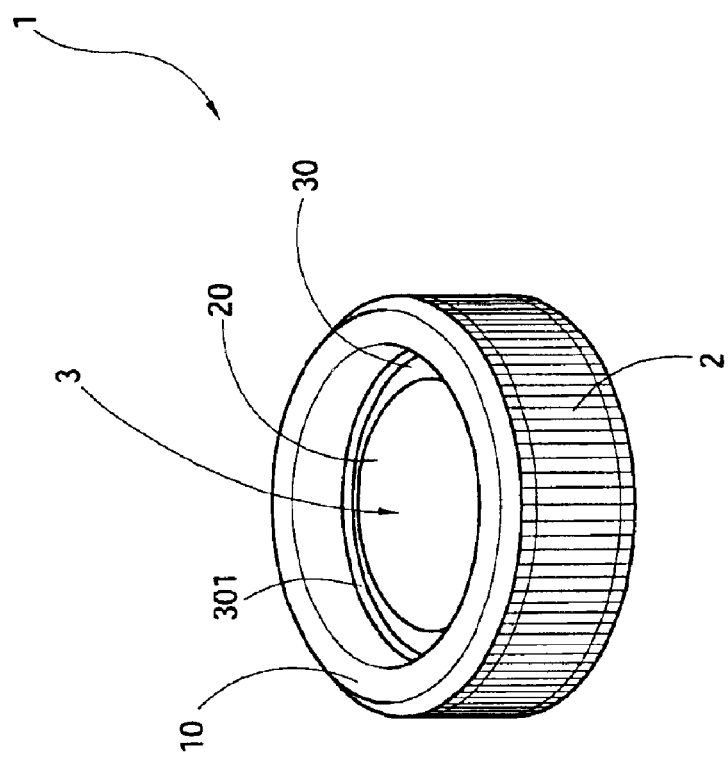
FIG. 1 is a perspective diagram of the first preferred embodiment of the present invention.
Figure 2A:
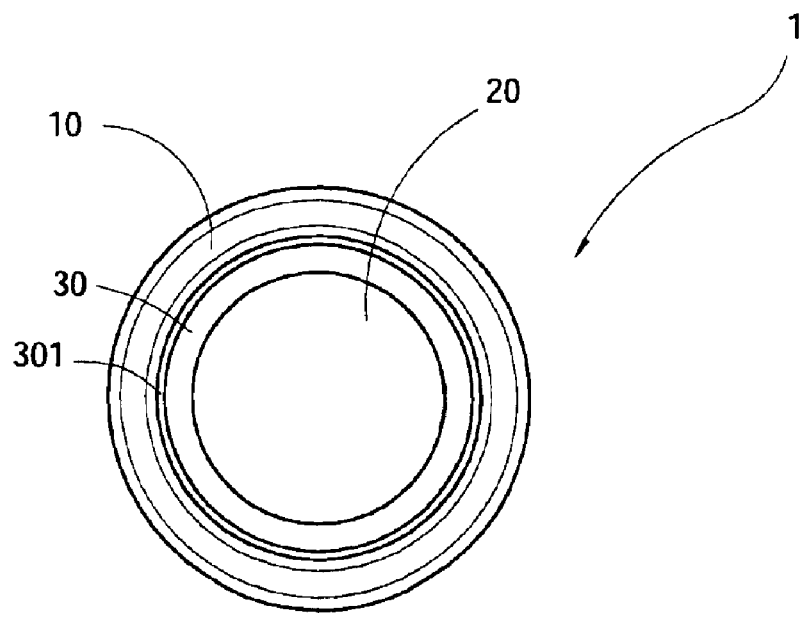
FIG. 2A is a top-view of the first preferred embodiment of the present invention.
Figure 2B:
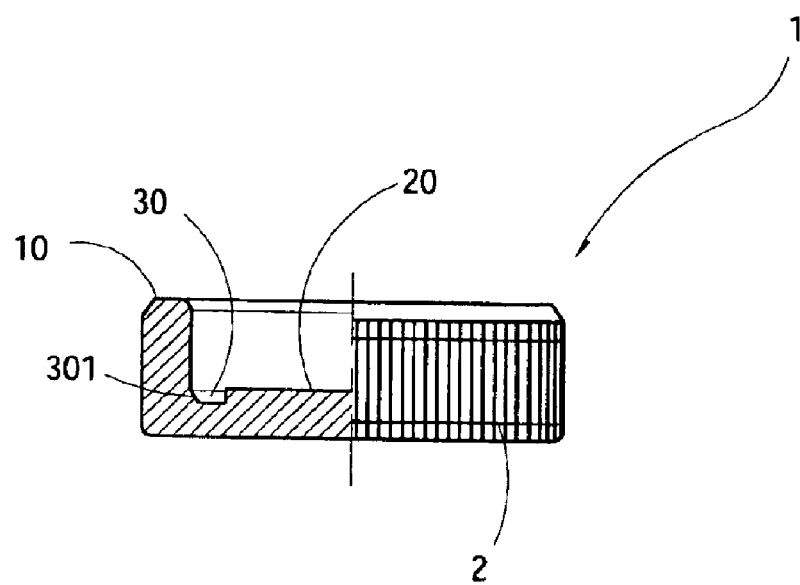
FIG. 2B is a cross-sectional diagram of the side view of the first preferred embodiment of the present invention.

Please refer to FIGS. 1, 2A and 2B for the perspective diagram, top-view diagram, and cross-sectional side-view diagram of the first preferred embodiment of this invention. In the figure, a rectification chip terminal structure according to this invention mounts a rectification chip into a terminal 1 by means of soldering and rubber injection, and inserts the chip into a pivotal hole (not shown in the figure) on the printed wire board. Such terminal 1 comprises a rib ring 10 surrounding the terminal 1, a platform 20 extended from the middle section of the terminal 1, a first buffer groove 30 formed between the platform 20 and the rib ring 10, and the first buffer groove 30 has a groove guiding corner 301. Therefore, under the situation of without changing the structure and volume of the terminal 1, when rubber is injected into the terminal 1, the rubber goes through the first buffer groove 30 for the fixing action, and constitutes a plastic surface to prevent water vapor and air from entering after the rubber is melted and solidified. As a result, the adhesion between the rubber and the terminal 1 is increased.

The platform increases the soldering area of the rectification chip, so that the terminal 1 and the rectification chip can be completely soldered together to give the best effect for a current of larger power.

Further, the foregoing terminal 1 is made integrally, and the surface of the periphery of the terminal 1 has a plurality of protruded threads 2 to facilitate assembling the terminal 1 into the pivotal hole (not shown in the figure) of the printed wire board.

When the terminal 1 of this invention is installed into the rectification chip, a solder preform is placed on the platform 20, and then a rectification chip is placed on such solder preform, and finally a conductive wire is placed on the solder preform. After the solder preform is heated, melted, and solidified, the rectification chip and the conductive wire can be soldered onto the platform 20 of the terminal 1. Finally, rubber is injected into the periphery of the terminal 1, so that the plastic material fills up an accommodating area 3 formed by the rib ring 10 to cover and seal the rectification chip. Since there is a first buffer groove 30 between the rib ring 10 around the terminal 1 and the platform 20, when rubber is injected into the accommodating area 3, the rubber goes through the first buffer groove 30 and produces an adhesion with the protruded ring 21 for the fixing.

Further, the terminal 1 has a platform 20 structure; when rubber is injected into the accommodating area 3, the platform 20 increases the soldering area of the rectification chip and completely solders the terminal 1 with the rectification chip to provide the best effect of a current with larger power.

Figure 3:
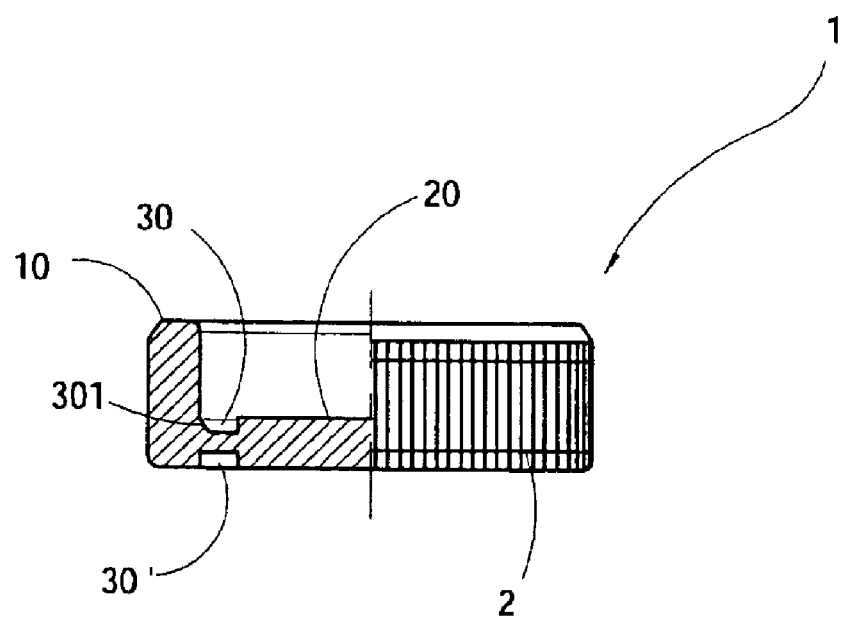
FIG. 3 is a cross-sectional diagram of the side view of the second preferred embodiment of the present invention.

Please refer to FIG. 3 for the cross-sectional diagram of the side view of the second preferred embodiment of the present invention. Unlike the embodiment shown in FIG. 2B, this embodiment has a second buffer groove 30' in the first buffer groove 30 at a position corresponding to the bottom of the terminal 1 in order to provide an appropriate buffer deformation stress for the rectification chip when rubber is injected or an external force is exerted, and it forms a plastic surface to prevent water vapor and air from entering.

Figure 4A:
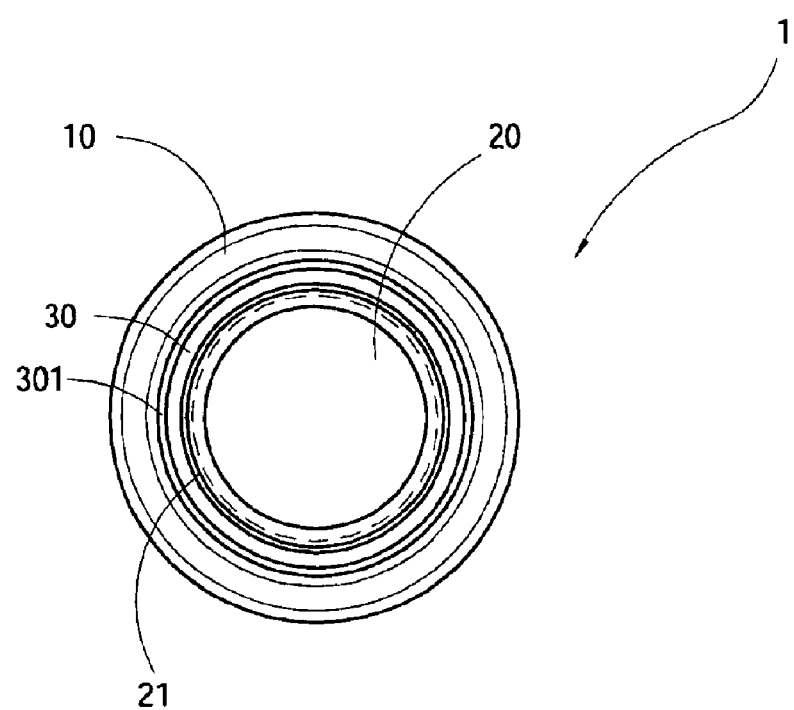
FIG. 4A is a top-view of the third preferred embodiment of the present invention.
Figure 4B:
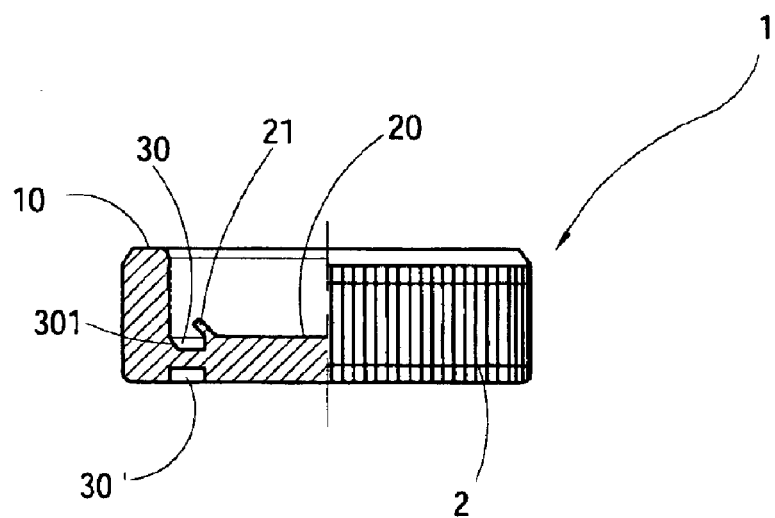
FIG. 4B is a cross-sectional diagram of the side view of the third preferred embodiment of the present invention.

Please refer to FIGS. 4A and 4B for the top-view and cross-sectional side view diagrams of the third embodiment of the present invention. In these figures, unlike the embodiment shown in FIG. 3, this embodiment extends a protruded ring 21 from the platform 20. When rubber is injected into the terminal 1, the rubber goes through the space between the first buffer groove 30 and the protruded ring 21 for the fixing action, and forms a plastic surface to prevent water vapor and air from entering after the rubber is melted and solidified in order to increase the adhesion between the injected rubber and the terminal 1. The platform 20 increases the soldering area of the rectification chip, such that the terminal 1 and rectification chip can be soldered completely together. In addition, this invention also enhances and prevents the injected rubber in the rectification chip from overflowing into the first buffer groove 30, which will cause the rubber unable to melt and solidified properly.

What is claimed is:

1. A rectification chip terminal structure, mounting a rectification chip into a terminal by soldering and rubber injection and inserting the rectification chip into a pivotal hole on a printed wire board, wherein said terminal comprising:
    a rib ring, surrounding the periphery of said terminal;
    a platform extended from the middle section of said terminal;
    a first buffer groove formed between said platform and said rib ring, and having a groove guiding corner; thereby, when rubber being injected into said terminal, the rubber going through said first buffer groove to constitute a fixing action, and forming a plastic surface to prevent water vapor and air from entering after the rubber being melted and solidified and thus increasing the adhesion between the injected rubber and said terminal; and said platform increases the soldering area of said rectification chip to give a complete solder between said terminal and chip and thus providing the effect for a current of larger power; and
    a second buffer groove formed in a bottom of said terminal in a position corresponding to said first buffer groove.

2. The rectification chip terminal structure of claim 1, wherein said terminal is made integrally, and said terminal has a plurality of protruded threads on the surface of the periphery of said terminal to facilitate assembling said terminal into the pivotal hole on a printed wire board.

3. A rectification chip terminal structure, mounting a rectification chip into a terminal by soldering and rubber injection and inserting the rectification chip into a pivotal hole on a printed wire board, wherein said terminal comprising:
    a rib ring, surrounding the periphery of said terminal;
    a platform extended from the middle section of said terminal;
    a first buffer groove formed between said platform and said rib ring;
    a protruded ring, extended from the periphery of said platform, and said first buffer groove having a groove guiding corner;
    thereby, when rubber being injected into said terminal, the rubber going through said first buffer groove to constitute
    a fixing action, and forming a plastic surface to prevent water vapor and air from entering after the rubber being melted and solidified and thus increasing the adhesion between the injected rubber and said terminal; and said platform increases the soldering area of said rectification chip to give a complete solder between said terminal and chip and thus providing the effect for a current of larger power; and
    a second buffer groove formed in a bottom of said terminal in a position corresponding to said first buffer groove.

4. The rectification chip terminal structure of claim 1 wherein said second buffer groove provides a buffer deformation stress for the rectification chip when rubber is injected or an external force is exerted, and forms a plastic surface to prevent water vapor and air from entering.

5. The rectification chip terminal structure of claim 3 wherein said second buffer groove provides a buffer deformation stress for the rectification chip when rubber is injected or an external force is exerted, and forms a plastic surface to prevent water vapor and air from entering.

6. The rectification chip terminal structure of claim 1, wherein said first buffer groove is located at a position deeper than said platform.

7. The rectification chip terminal structure of claim 3, wherein said first buffer groove is located at a position deeper than said platform.

* * * * *